United States Patent
Zhao et al.

(10) Patent No.: US 10,065,783 B2
(45) Date of Patent: Sep. 4, 2018

(54) LIQUID CRYSTAL PANEL PACKING BOX AND LIQUID CRYSTAL PANEL PACKING METHOD

(71) Applicant: Shenzhen China Star Optoelectronics Technology Co., Ltd., Shenzhen, Guangdong (CN)

(72) Inventors: Zhilin Zhao, Guangdong (CN); Shihhsiang Chen, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 476 days.

(21) Appl. No.: 14/420,371

(22) PCT Filed: Oct. 29, 2014

(86) PCT No.: PCT/CN2014/089835
§ 371 (c)(1),
(2) Date: Feb. 8, 2015

(87) PCT Pub. No.: WO2016/061835
PCT Pub. Date: Apr. 28, 2016

(65) Prior Publication Data
US 2016/0114955 A1    Apr. 28, 2016

(30) Foreign Application Priority Data
Oct. 24, 2014    (CN) .......................... 2014 1 0579964

(51) Int. Cl.
*B65D 85/48* (2006.01)
*B65D 81/07* (2006.01)
(Continued)

(52) U.S. Cl.
CPC .............. *B65D 81/07* (2013.01); *B65D 11/10* (2013.01); *B65D 11/22* (2013.01); *B65D 85/48* (2013.01);
(Continued)

(58) Field of Classification Search
CPC .... B65D 81/05; B65D 81/052; B65D 81/053; B65D 81/022; B65D 85/48; H01L 21/67363; H01L 21/67369
(Continued)

(56) References Cited

U.S. PATENT DOCUMENTS 2,979,246 A * 4/1961 Liebeskind ............ B65D 5/509
206/591
3,356,209 A * 12/1967 Pezely, Jr. ............ B65D 81/107
206/594
(Continued)

FOREIGN PATENT DOCUMENTS

CN    1807198 A    7/2006

*Primary Examiner* — Luan K Bui
(74) *Attorney, Agent, or Firm* — Andrew C. Cheng

(57) ABSTRACT

A liquid crystal panel packing box and a liquid crystal panel packing method are provided. The packing box is equipped with an elastic retractable member assembled in an accommodating groove thereof. The elastic retractable member is memory metal and can generate stretching and retracting effects with the change of temperature to thereby fix liquid crystal panels disposed in the packing box. Accordingly, in the processes of packing and transporting the liquid crystal panels, the seamless assembling between the liquid crystal panels and the packing box is realized, the damage caused by collision between edges of the liquid crystal panels and a box body of the packing box is avoided, the secondary impact generated resulting from the shift of the liquid crystal panels is eliminated and the safety is improved consequently.

10 Claims, 4 Drawing Sheets

(51) Int. Cl.
  *B65D 6/00* (2006.01)
  *B65D 6/34* (2006.01)
  *H01L 21/673* (2006.01)

(52) U.S. Cl.
  CPC .. *H01L 21/67363* (2013.01); *H01L 21/67369* (2013.01)

(58) Field of Classification Search
  USPC ............... 206/449, 454, 521, 523, 591, 594
  See application file for complete search history.

(56) References Cited

U.S. PATENT DOCUMENTS

| | | | | |
|---|---|---|---|---|
| 3,399,797 A | * | 9/1968 | Freeman | B65D 81/107 |
| | | | | 220/920 |
| 5,353,934 A | * | 10/1994 | Yamauchi | G03F 1/66 |
| | | | | 206/453 |
| 5,447,234 A | * | 9/1995 | Faulstick | B65D 25/06 |
| | | | | 206/449 |
| 7,644,820 B2 | * | 1/2010 | Hohne | B65D 81/053 |
| | | | | 206/449 |
| 7,931,146 B2 | * | 4/2011 | Chiu | B65D 85/48 |
| | | | | 206/454 |
| 9,376,251 B2 | * | 6/2016 | Hong | B65D 81/107 |
| 2008/0128310 A1 | * | 6/2008 | Kao | B65D 81/107 |
| | | | | 206/521 |
| 2013/0341240 A1 | * | 12/2013 | Chen | B65D 81/133 |
| | | | | 206/722 |
| 2014/0069834 A1 | * | 3/2014 | Kuo | B65D 81/022 |
| | | | | 206/454 |
| 2014/0069835 A1 | * | 3/2014 | Kuo | B65D 81/053 |
| | | | | 206/454 |
| 2015/0101947 A1 | * | 4/2015 | Shen | B65D 81/107 |
| | | | | 206/316.1 |

* cited by examiner

At normal-state temperature    At state-transition temperature

LIQUID CRYSTAL PANEL PACKING BOX AND LIQUID CRYSTAL PANEL PACKING METHOD

BACKGROUND OF THE INVENTION

1. Field of the Invention

The present invention relates to the field of packing technology, and particularly to a liquid crystal panel packing box and a liquid crystal panel packing method.

2. Description of Related Art

At present, there are various packing methods for liquid crystal panel in the panel industry and mainly are classified into: employing a tray manufactured by molding cushioning material using a foam mold, and employing a hard packing box manufactured by injection molding or blow molding. Relatively speaking, the foamed tray is widely used in the panel industry and has the advantages of such as light weight and good cushioning effect. The injection or blow molded hard packing box has a better rigidity than the foamed tray, since the packed liquid crystal panel is directly in contact with the box body, but the box body of the hard packing box does not have cushioning performance, and thus a soft retaining wall is required to be disposed inside the box body for providing cushioning effect.

In the above conventional packing methods, the liquid crystal panels are directly put into the box body, the box body and the liquid crystal panels have different gaps about 2~8 millimeters (mm) existed therebetween, the disposition of the gaps is limited by the precision of manufacturing technique of the packing box, the more precise the process tolerance is, the preset gap might be smaller but the gap cannot be zero. The assembling of two objects requires necessary matching gap existed therebetween, however if the inner object has a gap with the outer box, which would generate secondary impact to the assembled inner object in the course of falling, and the generated destructive force applied onto the inner object is multiple times of that in the first impact. The larger the manufacturing tolerance of the box body is, the gap formed when the box body matching with the inner object is more uncontrollable, and the protection performance of the packing box to the inner object is more unpredictable. Therefore, when the conventional packing method is used to pack the liquid crystal panel, there is a risk of the liquid crystal panel being damaged by the secondary impact. If the gap between the packed liquid crystal panel and the box body can be made to be zero, it can maximize to avoid the generation of secondary impact, and therefore can most effectively to protect the liquid crystal panel.

SUMMARY OF THE INVENTION

A technical problem to be solved by the present invention is to provide a liquid crystal panel packing box and a liquid crystal panel packing method, which have advantages of simple operation and good adaptability, can reduce the wear between the liquid crystal panel and the box body, can avoid the secondary impact generated resulting from the shift of the liquid crystal panel and thereby achieves the efficacy of protecting the liquid crystal panel.

A liquid crystal panel packing box at least includes a box body. The box body includes a base and multiple (i.e., more than one) sidewalls. The sidewalls are formed with multiple accommodating grooves. The liquid crystal panel packing box further is equipped with an elastic retractable member assembled in the accommodating grooves and configured (i.e., structured and arranged) for squeezing a liquid crystal panel in a horizontal direction.

In an exemplary embodiment, the elastic retractable member is a spiral spring. The spiral spring is square-shaped and includes a first end surface and a second end surface. The first end surface and the second end surface are flat surfaces.

In an exemplary embodiment, the elastic retractable member is an elastic hoop. The elastic hoop includes a retractable portion which is configured for contacting with a side surface of the liquid crystal panel and a first engaging plate which is configured for fixing the elastic hoop. The retractable portion is heart-shaped, and the first engaging plate is in contact with the box body.

In an exemplary embodiment, the elastic retractable member is a bent member. The bent member includes a bent portion which is configured for contacting with a side surface of the liquid crystal panel and a second engaging plate which is configured for fixing the bent member. An end surface of the bent portion is a flat surface, and the second engaging plate is in contact with the box body.

In an exemplary embodiment, the first end surface is tightly in contact with the box body, and the second end surface is configured for contacting with the side surface of the liquid crystal panel.

In an exemplary embodiment, the accommodating grooves each are formed with a slot corresponding to the first engaging plate or the second engaging plate and thereby allowing the first engaging plate or the second engaging plate to be inserted therein.

In an exemplary embodiment, the base is disposed with a plurality of recesses, and the plurality of recesses are equipped with an elastic retractable member for squeezing the liquid crystal panel in a vertical direction.

In an exemplary embodiment, the elastic retractable member is memory metal, and a material of the memory metal is one of selected from the group consisting of nickel-titanium alloy, copper-zinc alloy, copper-aluminium-nickel alloy, copper-molybdenum-nickel alloy and copper-gold-zinc alloy.

In addition, a liquid crystal panel packing method includes the following steps of: (1) providing a packing box and elastic retractable members, a material of each of the elastic retractable members being nickel-titanium alloy, the elastic retractable members being compressible at a normal-state temperature, and when a temperature is increased from the normal-state temperature up to a state-transition temperature, the compressed elastic retractable members each restore to its original state; (2) at the normal-state temperature, disposing some of the compressed elastic retractable members into recesses of a base of a box body of the packing box; (3) disposing multiple liquid crystal panels in the box body, the liquid crystal panels having a spacing layer disposed therebetween; (4) at the normal-state temperature, disposing the other compressed elastic retractable members in accommodating grooves of sidewalls of the box body; (5) in a transportation process, a temperature being changed from the normal-state temperature to the state-transition temperature, the compressed elastic retractable members each restoring to its original state to thereby squeeze the liquid crystal panels.

In an exemplary embodiment, the normal-state temperature is between 20° C. and 40° C., and the state-transition temperature is between 40° C. and 60° C.

Beneficial Effects of the Present Invention:

In the processes of packing and transporting the liquid crystal panels, by using the characteristic of memory metal, the cushioning member in the liquid crystal panel packing box is designed to be an elastic retractable member which is retractable with the change of temperature, so as to realize the tight seamless assembling between the liquid crystal panels and the packing box, avoid the damage caused by collision between edges of the liquid crystal panels and the box body as well as the secondary impact generated resulting from the shift of liquid crystal panels, and therefore the safety performance is improved and the product cost is indirectly optimized.

BRIEF DESCRIPTION OF THE DRAWINGS

The above and other aspects, features and advantages of embodiments of the present invention will be more apparent from the following detailed description taken in conjunction with the accompanying drawings, in which.

DETAILED DESCRIPTION OF EMBODIMENTS

Figure 1:
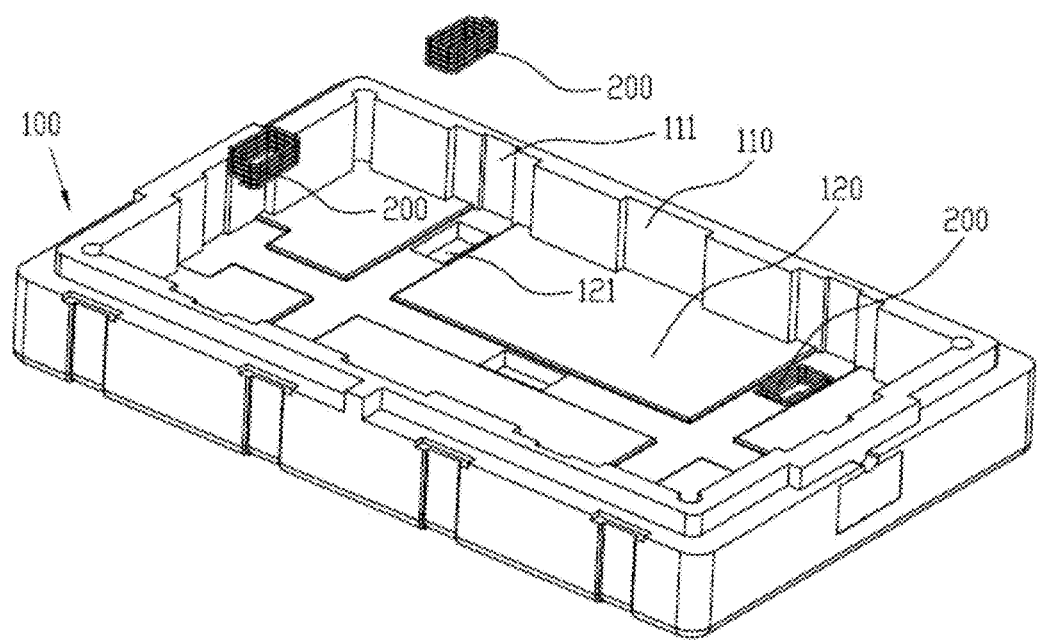
FIG. 1 is a schematic structural view of installing elastic retractable members on a base of a packing box according to embodiment 1 of the present invention.
Figure 2:
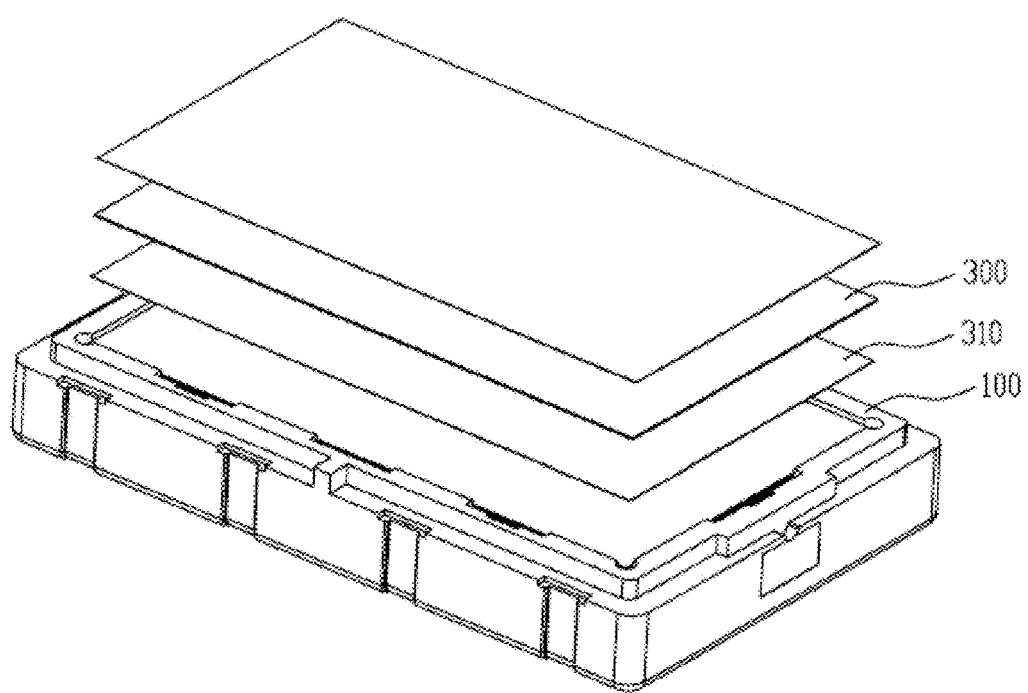
FIG. 2 is a schematic structural view of installing liquid crystal panels in the packing box according to the embodiment 1 of the present invention.
Figure 3:
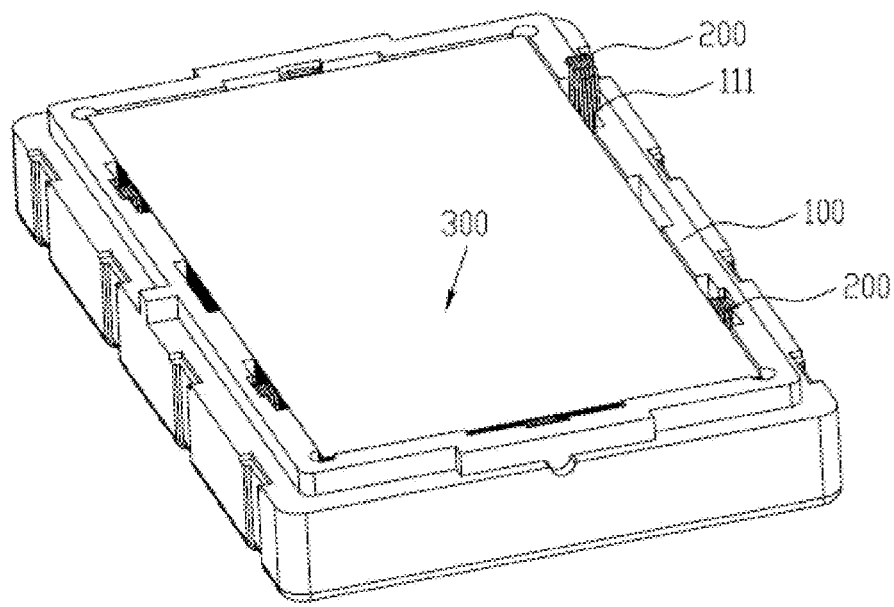
FIG. 3 is a schematic structural view of installing elastic retractable members on sidewalls of the packing box according to the embodiment 1 of the present invention.
Figure 4:
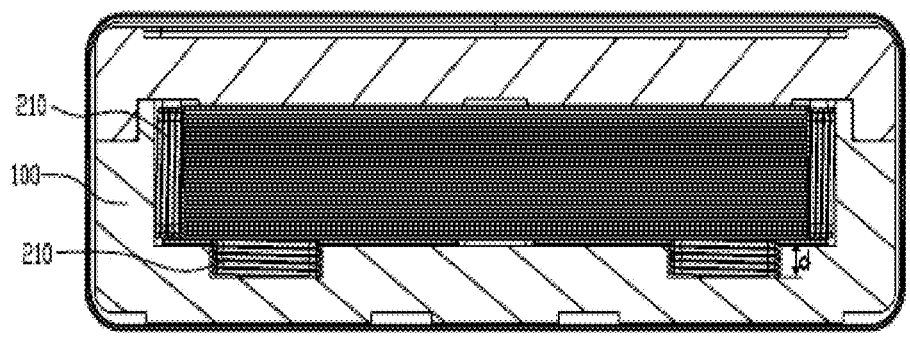
FIG. 4 is schematic structural views of the elastic retractable members in the packing box at two temperatures according to the embodiment 1 of the present invention.
Figure 4:
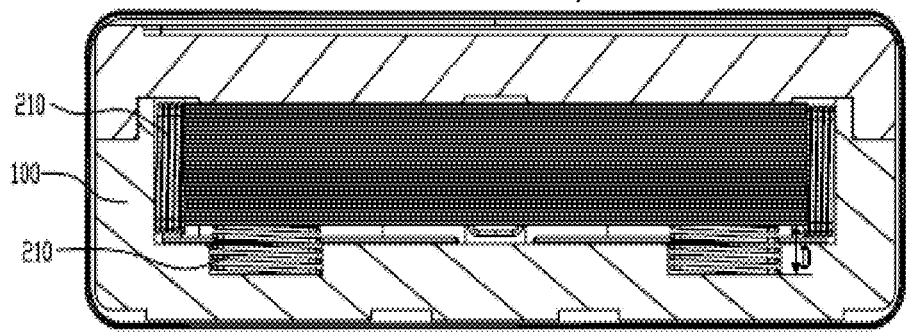

As described in the foregoing, the present invention addresses the drawbacks in the prior art and provides a liquid crystal panel packing box and a liquid crystal panel packing method. The packing box includes a box body and an elastic retractable member. At least two opposite sidewalls of the box body are formed with multiple accommodating grooves. The elastic retractable member is disposed in the accommodating grooves. An end of the elastic retractable member is configured for contacting with a liquid crystal panel, and another end of the elastic retractable member is in contact with the box body. The elastic retractable member for example is a nickel-titanium alloy. At a normal-state temperature, compressed elastic retractable member cannot restore to its original state and thus is suitable for installing. When the temperature is changed from the normal-state temperature to a state-transition temperature, the compressed elastic retractable member will restore to its original state to thereby generate an effect of squeezing the liquid crystal panel, a seamless tight engagement between the liquid crystal panel and the packing box is realized, the secondary impact generated resulting from the shift of liquid crystal panel in the transportation process is avoided, and the damage degree of external impact to the packed object is reduced.

In order to better illustrate the features and structures of the present invention, preferred embodiments of the present invention will be described below in detail with reference to accompanying drawings.

Embodiment 1

Referring to FIG. 1 through FIG. 4, the embodiment 1 provides a liquid crystal panel packing box and a liquid crystal panel packing method, which will be described in detail as follows.

A packing box is provided. The packing box at least includes a box body 100. The box body 100 has multiple (i.e., more than one) sidewalls 110 and a base 120. At least two opposite sidewalls 110 are formed with multiple accommodating grooves 111. The base 120 is formed with multiple recesses 121. In the illustrated embodiment, the amount/number of the sidewalls 110 formed with the accommodating grooves 111 is four, and each two opposite sidewalls 110 in the four sidewalls 110 each are formed with two accommodating grooves 111, and the accommodating grooves 111 formed on opposite sidewalls 110 are mutually corresponding to each other and for balancing the spring tension when squeezing the liquid crystal panel 300. The amount/number of the recesses 121 formed on the base 120 is four, and the four recesses 121 are mutually corresponding to each other and arranged in a ring array.

Elastic retractable members 200 are provided. A microstructure of each the elastic retractable member 200 exhibits different crystal structures at different temperatures and has two stable states. An original state of the elastic retractable member 200 is formed at a high temperature by forging, but the elastic retractable member 200 is compressible or stretchable at a normal-state temperature. When the temperature is raised up to a state-transition temperature again, the compressed or stretched elastic retractable member 200 will restore to its original state. A material of the elastic retractable member 200 provided by the present invention is memory metal. A material of the memory metal for example is one of nickel-titanium alloy, copper-zinc alloy, copper-aluminum-nickel alloy, copper-molybdenum-nickel alloy and copper-gold-zinc alloy. In this embodiment, the material of the elastic retractable member 200 is nickel-titanium alloy, by using the characteristic f the compressed elastic retractable member 200 restoring to its original state at a temperature higher than the critical temperature to squeeze and fix the liquid crystal panel 300, a seamless tight engagement between the liquid crystal panel 300 and the box body 100 is realized. The critical temperature of the nickel-titanium alloy restoring to its original state is 40° C.

In the normal-state temperature, some of the compressed elastic retractable members 200 are installed in the recesses 121 of the base 120 and configured for squeezing liquid crystal panels 300 in the packing box. Each the elastic retractable member 200 is a spiral spring 210 and is square-shaped. The spiral spring 210 has a first end surface and a second end surface. The first end surface is tightly in contact with the base 120 of the box body 100, and the second end surface is in contact with a bottom surface of the liquid crystal panel 300. The first end surface and the second end surface are flat surfaces. The normal-state temperature is between 20° C. and 40° C.

Multiple liquid crystal panels 300 are disposed in the box body 100 which has been assembled with the elastic retractable members 300 on the base 120. Each two neighboring liquid crystal panels 300 are disposed with a spacing layer 310 therebetween for cushioning to protect the neighboring liquid crystal panels 300 and avoid scratches and local damage caused by squeeze between the neighboring liquid crystal panels. The spacing layer 310 can be disposed with a cushioning pad of soft material.

In the normal-state temperature, the other compressed elastic retractable members 200 are assembled into the accommodating grooves 111 on the sidewalls 110 of the box body 100 and for squeezing side surfaces of the liquid crystal panels 300 packed in the packing box. The first end surface of each the elastic retractable member 200 is tightly in contact with the sidewall 110 of the box body 100, and the second end surface of each the elastic retractable member 200 is in contact with the side surfaces of the liquid crystal panels 300. The normal-state temperature is between 20° C. and 40° C.

In a transportation process, the temperature is changed from the normal-state temperature to the state-transition temperature, and the state-transition temperature is between 40° C. and 60° C. The compressed elastic retractable members 200 disposed in the box body 100 each restore to its original state. In particular, the compressed elastic retractable members 200 assembled on the base 120 of the box body 100 squeeze the liquid crystal panels 300 in the vertical direction to thereby limit the movement of the liquid crystal panels 300 in the vertical direction, and the elastic retractable members 200 assembled on the sidewalls 110 of the box body 100 squeeze the liquid crystal panels 300 in the horizontal direction to thereby limit the movement of the liquid crystal panels 300 in the horizontal direction. As a result, a seamless tight engagement between the liquid crystal panel 300 and the packing box in both the vertical direction and the horizontal direction are realized.

It is noted that, in actual packing process, temperatures in the workshop and warehouse are at the normal-state temperature; and in the transportation process of packing box, a temperature in the transportation container generally is at the state-transition temperature. By using the temperature difference between different environments, the performance of the nickel-titanium alloy restoring its original state is achieved. It is assumed that the compressed elastic retractable members 200 each have a thickness d at the normal-state temperature, when the temperature is changed from the normal-state temperature to the state-transition temperature, the elastic retractable members 200 each restore to its original state and have a thickness D. Since the thickness D of the elastic retractable member 200 restored at its original state is greater than the thickness d of the compressed elastic retractable member 200, and therefore a squeezing effect to the liquid crystal panels 300 is realized.

When the packing box is transported to destination, the packing box is taken out from the transportation container and will return back to the normal-state temperature. The elastic retractable members 200 each are compressed again and thereby withdraw the squeezing effect to the liquid crystal panels 300, and thus the liquid crystal panels 300 can be conveniently taken out from the packing box. In the processes of packing, transportation and reopening, the liquid crystal panels 300 are in the squeeze protection of the elastic retractable members 200, the damage caused by collision between edges of the liquid crystal panels 300 and the box body 100 is avoided, the tight seamless engagement between the liquid crystal panels 300 and the box body 100 is realized, the secondary impact generated resulting from the shift of the liquid crystal panels 300 is avoid, and therefore the safety performance is improved.

Embodiment 2

Figure 5:
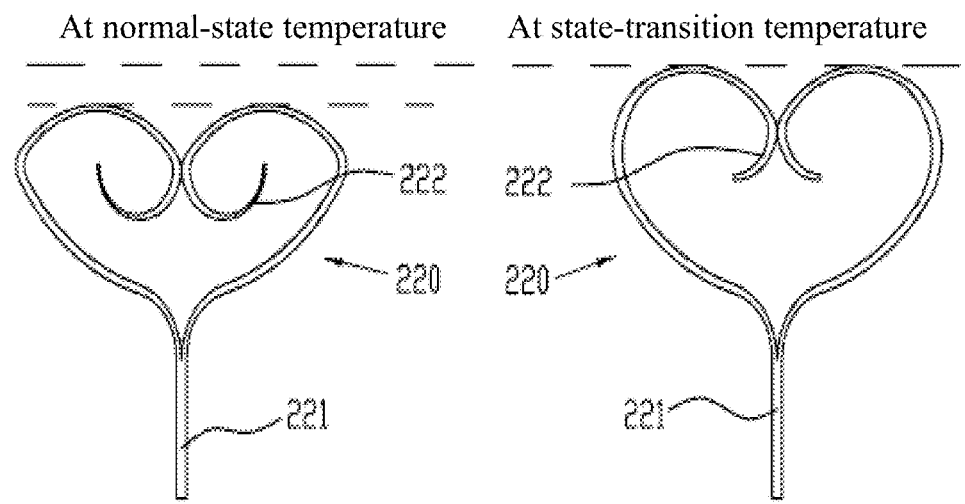
FIG. 5 is schematic structural views of an elastic retractable member being an elastic hoop according to embodiment 2 of the present invention.
Figure 6:
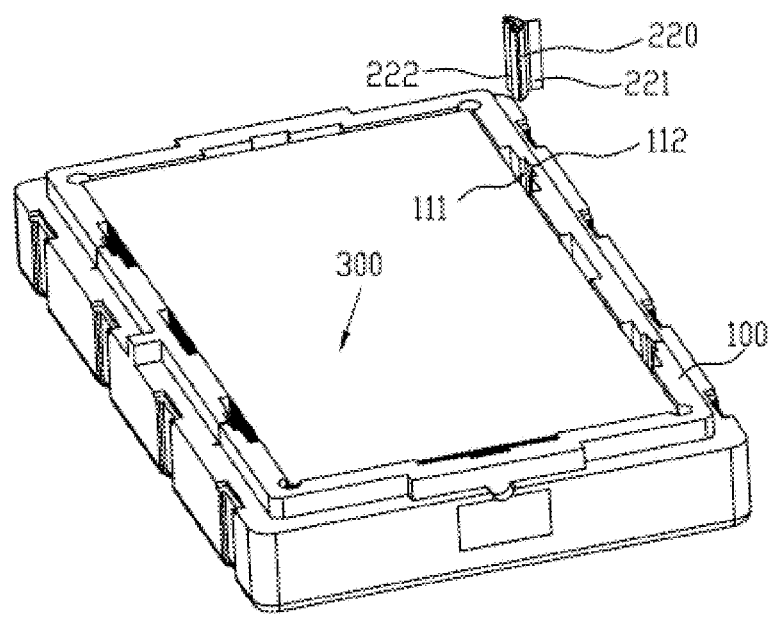
FIG. 6 is a schematic structural view of installing the elastic hoops in a packing box according to the embodiment 2 of the present invention.

Referring to FIG. 5 and FIG. 6, the elastic retractable member 200 may be an elastic hoop 220. At a normal-state temperature, compressed elastic hoop 220 is assembled in the accommodating groove 111 of the sidewall 110. The elastic hoop 220 has a retractable portion 222. The retractable portion 222 is heart-shaped and in contact with the side surfaces of the liquid crystal panels 300 to thereby squeeze and fix the liquid crystal panels 300 by stretching and retracting deformations. The elastic hoop 220 further is formed with a first engaging plate 221, and correspondingly the accommodating groove 111 is formed with a slot 112 engageable with the first engaging plate 221. When the elastic hoop 220 is assembled to the accommodating groove 111 of the sidewall 110, the first engaging plate 221 is assembled in the slot 112 to thereby fix the elastic hoop 220. In this embodiment, a material of the elastic retractable member 200 is copper-zinc alloy.

Embodiment 3

Figure 7:
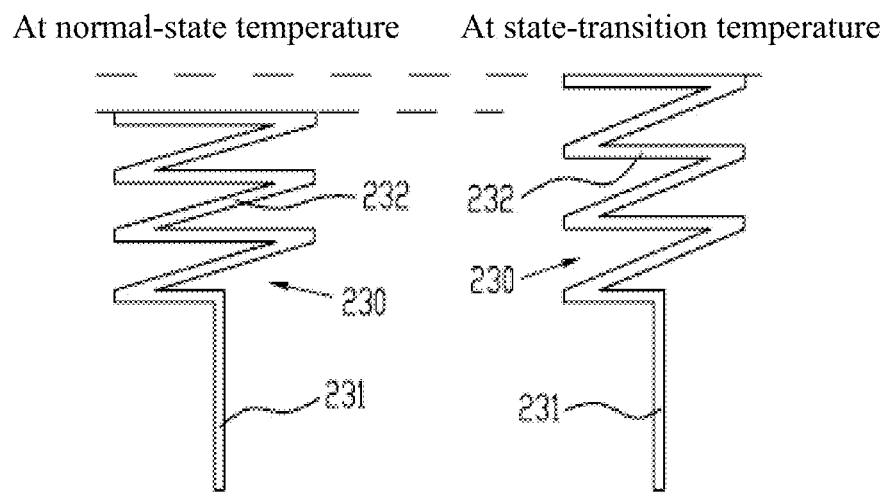
FIG. 7 is schematic structural views of an elastic retractable member being a bent member according to embodiment 3 of the present invention.
Figure 8:
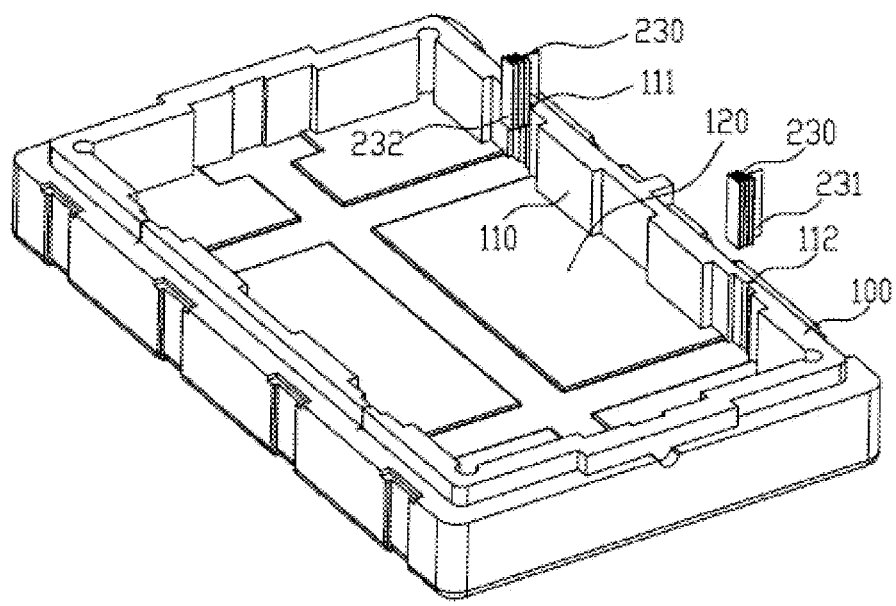
FIG. 8 is a schematic structural view of installing the bent members in a packing box according to the embodiment 3 of the present invention.

Referring to FIG. 7 and FIG. 8, the elastic retractable member 200 may be a bent member 230. At a normal-state temperature, the compressed bent member 230 is assembled in the accommodating groove 111 of the sidewall 110. The bent member 230 is formed with a bent portion 232 and a second engaging plate 231 for fixing the bent member 230. An end of the bent portion 232 is a flat surface, and another end of the bent portion 232 is connected with the second engaging plate 231. The bent portion 232 has a Z-shaped bent shape. The flat surface of the end of the bent portion 232 is in contact with liquid crystal panels 300 to thereby squeeze and fix the liquid crystal panels 300 by stretching and retracting deformations. The accommodating groove 111 is formed with a slot 112 engageable with the second engaging plate 231. When the bent member 230 is assembled in the accommodating groove 111 of the sidewall 110, the second engaging plate 231 is assembled in the slot 112 to thereby fix the bent member 230. In this embodiment, a material of the elastic retractable member 200 is copper-aluminum-nickel alloy.

It is indicated that, in this specification, the relational terminologies such as "first" and "second" only are intended to discriminate an entity or operation from another entity or operation, and not necessarily to require or imply these entities or operations having actual relationships or orders existed therebetween. Moreover, the terminology of "including", "containing" or variations thereof is meant to cover non-exclusive inclusion, so that a process, method, article or apparatus including a series of items not only includes listed items but also includes other item(s) not being explicitly listed or inherent item(s) of the process, method, article or apparatus. In the absence of more restrictive conditions, the item limited by the phraseology "including one" does not exclude the existence of additional identical item(s) in the process, method, article or apparatus including the item.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A liquid crystal panel packing box at least comprising a box body, wherein the box body comprises a base and a plurality of sidewalls, the plurality of sidewalls are formed with a plurality of accommodating grooves; the liquid crystal panel packing box further is disposed with an elastic retractable member assembled in the plurality of accommodating grooves and configured for squeezing a liquid crystal panel in a horizontal direction;

wherein the base is disposed with a plurality of recesses, and the plurality of recesses each are equipped with an elastic retractable member for squeezing the liquid crystal panel in a vertical direction;

wherein the elastic retractable member is compressible at a normal-state temperature, and when a temperature is increased from the normal-state temperature up to a state-transition temperature, the compressed elastic retractable member restores to its original state; and wherein the normal-state temperature is between 20° C. and 40° C., and the state-transition temperature is between 40° C. and 60° C.

2. The liquid crystal panel packing box according to claim 1, wherein the elastic retractable member is a spiral spring; the spiral spring is square-shaped and has a first end surface and a second end surface, the first end surface and the second end surface are flat surfaces.

3. The liquid crystal panel packing box according to claim 2, wherein the first end surface is tightly in contact with the box body, and the second end surface is configured for contacting with a side surface of the liquid crystal panel.

4. The liquid crystal panel packing box according to claim 2, wherein the elastic retractable member is memory metal, and a material of the memory metal is one of selected from the group consisting of nickel-titanium alloy, copper-zinc alloy, copper-aluminium-nickel alloy, copper-molybdenum-nickel alloy and copper-gold-zinc alloy.

5. The liquid crystal panel packing box according to claim 1, the elastic retractable member is an elastic hoop; the elastic hoop comprises a retractable portion which is configured for contacting with a side surface of the liquid crystal panel and a first engaging plate which is configured for fixing the elastic hoop; the retractable portion is heart-shaped, and the first engaging plate is in contact with the box body.

6. The liquid crystal panel packing box according to claim 5, wherein the plurality of accommodating grooves each are formed with a slot corresponding to the first engaging plate and thereby allowing the first engaging plate to be inserted therein.

7. The liquid crystal panel packing box according to claim 5, wherein the elastic retractable member is memory metal, and a material of the memory metal is one of selected from the group consisting of nickel-titanium alloy, copper-zinc alloy, copper-aluminium-nickel alloy, copper-molybdenum-nickel alloy and copper-gold-zinc alloy.

8. The liquid crystal panel packing box according to claim 1, wherein the elastic retractable member is a bent member; the bent member comprises a bent portion which is configured for contacting with a side surface of the liquid crystal panel and a second engaging plate which is configured for fixing the bent member; an end surface of the bent portion is a flat surface, and the second engaging plate is in contact with the box body.

9. The liquid crystal panel packing box according to claim 8, wherein the plurality of accommodating grooves each are formed with a slot corresponding to the second engaging plate and thereby allowing the second engaging plate to be inserted therein.

10. The liquid crystal panel packing box according to claim 8, wherein the elastic retractable member is memory metal, and a material of the memory metal is one of selected from the group consisting of nickel-titanium alloy, copper-zinc alloy, copper-aluminium-nickel alloy, copper-molybdenum-nickel alloy and copper-gold-zinc alloy.

* * * * *